(12) United States Patent
Clyne et al.

(10) Patent No.: US 10,858,787 B2
(45) Date of Patent: Dec. 8, 2020

(54) RAIL SWITCH HEATER

(71) Applicant: Backer EHP Inc., Murfreesboro, TN (US)

(72) Inventors: Kevin M. Clyne, Edgewater, NJ (US); Jimmy Hjort Andersson, Copenhagen (DK)

(73) Assignee: Backer EHP Inc., Murfreesboro, TN (US)

( * ) Notice: Subject to any disclaimer, the term of this patent is extended or adjusted under 35 U.S.C. 154(b) by 172 days.

(21) Appl. No.: 16/139,452

(22) Filed: Sep. 24, 2018

(65) Prior Publication Data

US 2019/0106845 A1   Apr. 11, 2019

Related U.S. Application Data

(60) Provisional application No. 62/571,093, filed on Oct. 11, 2017.

(51) Int. Cl.
*E01B 7/24*   (2006.01)
*H03K 7/08*   (2006.01)

(52) U.S. Cl.
CPC .................... *E01B 7/24* (2013.01); *H03K 7/08* (2013.01)

(58) Field of Classification Search
CPC .................... E01B 7/24; H03K 7/08
See application file for complete search history.

(56) References Cited

U.S. PATENT DOCUMENTS

| 4,687,163 A * | 8/1987 | Ringer ................... E01B 7/24 |
| | | 126/271.2 B |
| 6,308,635 B1 | 10/2001 | Abele |
| 2013/0220991 A1 | 8/2013 | Honeck et al. |
| 2015/0086185 A1 | 3/2015 | Semyanko et al. |

FOREIGN PATENT DOCUMENTS

CN   106150804   11/2016

OTHER PUBLICATIONS

International Search Report dated Dec. 14, 2018 for International Application No. PCT/US18/55478 (2 pages).
Written Opinion of the International Searching Authority dated Dec. 14, 2018 for International Application No. PCT/US18/55478 (22 pages).

* cited by examiner

*Primary Examiner* — Geoffrey S Evans
(74) *Attorney, Agent, or Firm* — Neal, Gerber & Eisenberg LLP; Thomas E. Williams

(57) ABSTRACT

An embodiment of a rail switch heating system is disclosed, including a controller comprising a processor and memory, an electrically resistive heating element coupled to the controller, the heating element configured for mounting to and heating a railroad rail, and software stored on the memory for executing the steps of: (a) automatically determining a pulse width modulated (PWM) cycle corresponding to a target energy consumption for cycling the heating element on and off; and (b) cycling the heating element on and off according to the PWM cycle.

19 Claims, 10 Drawing Sheets

10 ↘

| Single W/ft | PWM - % | On sec. | Off sec. |
|---|---|---|---|
| 75 | 30 | 12 | 28 |
| 100 | 40 | 16 | 24 |
| 125 | 50 | 20 | 20 |
| 150 | 60 | 24 | 16 |
| 175 | 70 | 28 | 12 |
| 200 | 80 | 32 | 8 |
| 225 | 90 | 36 | 4 |
| 250 | 100 | 40 | 0 |

| Dual W/ft | PWM - % | On sec. | Off sec. |
|---|---|---|---|
| 275 | 55 | 22 | 18 |
| 300 | 60 | 24 | 16 |
| 325 | 65 | 26 | 14 |
| 350 | 70 | 28 | 12 |
| 375 | 75 | 30 | 10 |
| 400 | 80 | 32 | 8 |
| 425 | 85 | 34 | 6 |
| 450 | 90 | 36 | 4 |
| 475 | 95 | 38 | 2 |
| 500 | 100 | 40 | 0 |

FIG. 9

RAIL SWITCH HEATER

CROSS-REFERENCE TO RELATED APPLICATIONS

This application claims the benefit of U.S. Provisional Patent Application No. 62/571,093, filed on Oct. 11, 2017, which is hereby incorporated herein by reference in its entirety.

BACKGROUND

The railroad industry, including passenger railroads, freight railroads, and other industry railroads, use rail switches to direct trains from one track to another. Rail switches include a rail switch machine connected to a rail switch rod to laterally move a switch rail to direct a train from one track to another. A rail switch machine typically includes an electric, hydraulic or pneumatic mechanism to cause the switch rod to move the switch rail, which includes a pair of tapered rails that laterally move from one side of the track to the other. Switch machines may be remotely controlled and operated by a remote railroad dispatching center, or they may be automatically or manually controlled and operated at or near the switch point itself.

Switch rods are the conduit between the switch machine and the switch points. Switch rods are connected at one end to the switch machine and at the other end to the switch point(s). When the switch machine moves the rods from one side to the other (only two positions are available) the rods will move the switch points from one side of the track to the other.

Electric heating elements convert electrical energy to heat energy. Rail switch heaters have been used to melt snow and ice on railway switch heaters and around railway switch actuation machines. Wind and cold temperatures, or a combination of the two, are known to reduce the effectiveness of conventional railway switch heaters, and especially railway switch point heaters.

To help ensure that rail switches in remote locations function at all times, rail switch heaters are typically sized to raise the temperature of rail switch machine components to a level that permits operation of the rail switch machines during expected worst case atmospheric conditions of extreme cold temperatures, high winds, and the like. However, the worst case atmospheric conditions seldom occur at any particular switch point on a railroad network, resulting in rail switch heaters that are substantially oversized for less demanding atmospheric conditions that more typically occur. This results in costly oversized rail switch heater systems installed across the rail network, as well as excessive daily operational expenses from generating more heat than dictated by atmospheric conditions.

There exists a need, therefore, for a solution that addresses these and other problems.

SUMMARY

Disclosed are various embodiments and aspects of an electric rail switch heating system configured to regulate the temperature of a railroad switch rail and related switch components.

In one embodiment, a rail switch heating system of the instant disclosure includes a controller comprising a processor and memory, an electrically resistive heating element coupled to the controller, the heating element configured for mounting to and heating a railroad rail, a first sensor coupled to the controller, the first sensor configured to detect and/or measure a temperature of the rail to provide first input data to the controller, a second sensor coupled to the controller, the second sensor configured to detect and/or measure an air temperature in a vicinity of the rail to provide second input data to the controller, and software stored on the memory and executable by the processor for executing the steps of: (a) automatically determining a target energy consumption for the heating element based on the first input data and the second input data; (b) automatically determining a pulse width modulated (PWM) cycle corresponding to the target energy consumption for cycling the heating element on and off; and (c) if either the first input data or the second input data fall below a first minimum threshold temperature corresponding to the first input data or a second minimum threshold temperature corresponding to the second input data, automatically cycling a flow of electricity on and off to the heating element in accordance with the PWM cycle.

The rail switch heating system may include a second electrically resistive heating element coupled to the controller, where the second electrically resistive heating element may be positioned in a pan in proximity to a switch rod of a railroad switch. The rail switch heating system may include a third electrically resistive heating element for positioning on the rail in parallel to the first electrically resistive heating element. The rail switch heating system may include a relay coupled to the controller for closing and opening an electrical circuit to energize and de-energize the heating element according to the PWM cycle. The relay may be a solid state relay.

The controller may be configured to cease cycling the flow of electricity to the heating element upon the occurrence of (1) the first input data exceeding a first maximum threshold temperature, (2) the second input data exceeding a second maximum threshold temperature, or (3) the passage of a predetermined amount of time.

The rail switch heating system may include a third sensor for detecting and/or measuring one or more environmental conditions in the vicinity of the rail. The environmental conditions may include one of air temperature, relative humidity, icing conditions, cloud cover, wind speed, wind direction, and barometric pressure.

The rail switch heating system may include third input data to the controller, where the third input data may include at least one of a time of day and a date, and wherein automatically determining the target energy consumption for the heating element is based on the third input data.

The rail switch heating system may include an antenna for receiving weather forecast data from a remote server, where automatically determining the target energy consumption for the heating element is based on the weather forecast data. The rail switch heating system may include an antenna for transmitting the first input data to a remote server. The PWM cycle may vary from 30% to 100% corresponding to a range of 75 watts per foot to 250 watts per foot effective average energy consumption for a 250 watts per foot heating element.

In another embodiment, a rail switch heating system of the instant disclosure includes a controller comprising a processor and memory, an electrically resistive heating element coupled to the controller, the heating element configured for mounting to and heating a railroad rail, a first sensor coupled to the controller, the first sensor configured to detect and/or measure a temperature of the rail to provide first input data to the controller, a second sensor coupled to the controller, the second sensor configured to detect and/or measure an air temperature in a vicinity of the rail to provide second input data to the controller, and software stored on the memory for executing the steps of: (a) automatically determining a pulse width modulated (PWM) cycle corresponding to a target energy consumption for cycling the heating element on and off; and (b) if either the first input data or the second input data fall below a first minimum threshold temperature corresponding to the first input data or a second minimum threshold temperature corresponding to the second input data, automatically cycling a flow of electricity to the heating element in accordance with the PWM cycle.

The target energy consumption may be automatically determined based on the first input data and the second input data. The rail switch heating system may include a relay coupled to the controller for closing and opening an electrical circuit to energize and de-energize the heating element according to the PWM cycle. The relay may be a solid state relay.

The controller may be configured to cease cycling the flow of electricity to the heating element upon the occurrence of (1) the first input data exceeding a first maximum threshold temperature, (2) the second input data exceeding a second maximum threshold temperature, or (3) the passage of a predetermined amount of time. The rail switch heating system may include an antenna for receiving weather forecast data from a remote server, where automatically determining the target energy consumption for the heating element is based on weather forecast data received by the controller. The PWM cycle may vary from 30% to 100% corresponding to a range of 75 watts per foot to 250 watts per foot effective average energy consumption for a 250 watts per foot heating element.

In another embodiment, a rail switch heating system of the instant disclosure includes a controller comprising a processor and memory, an electrically resistive heating element coupled to the controller, the heating element configured for mounting to and heating a railroad rail, and software stored on the memory for executing the steps of: (a) automatically determining a pulse width modulated (PWM) cycle corresponding to a target energy consumption for cycling the heating element on and off; and (b) cycling the heating element on and off according to the PWM cycle.

BRIEF DESCRIPTION OF THE DRAWINGS

The patent application file contains at least one drawing executed in color. Copies of this patent application with color drawing(s) will be provided by the Office upon request and payment of the necessary fee.

FIG. 9 is a PWM cycle schedule corresponding to an embodiment of a rail switch heating system of the instant disclosure.

DETAILED DESCRIPTION

Figure 1:
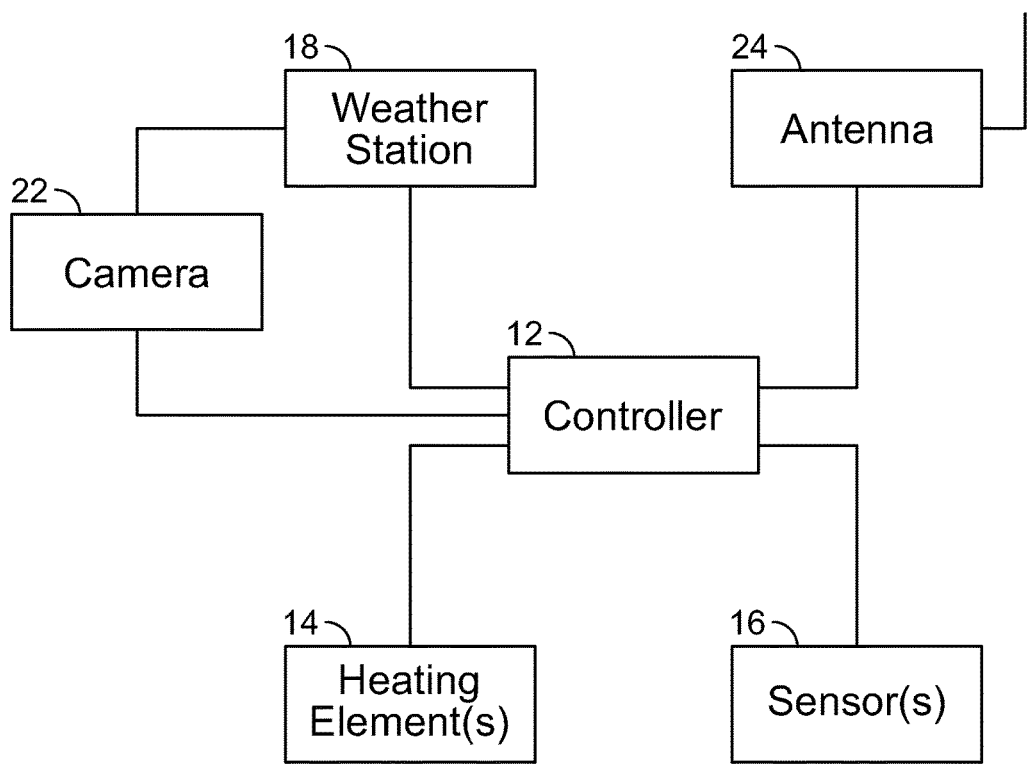
FIG. 1 is a schematic view of an embodiment of an electric rail switch heating system of the instant disclosure.

Although the figures and the instant disclosure describe one or more embodiments of a railway switch heater and related system, one of ordinary skill in the art would appreciate that the teachings of the instant disclosure would not be limited to these embodiments. For example, the teachings of the instant disclosure may be applied to controlling the temperature or heat output of any electric heating element. It should be appreciated that any of the features of an embodiment discussed with reference to the figures herein may be combined with or substituted for features discussed in connection with other embodiments in this disclosure.

Remotely controlled or locally controlled rail switches allow for rail traffic in all modes of rail transportation. To effect the switch commands from a remote dispatch system, or conduct localized railway switch control, the switch machine must be free of all encumbrances that would prevent the movement of the switch rail from one track to another. In warm atmospheric conditions, this is generally not an issue unless debris or foliage, for example, falls onto the track and impedes the movement of any of the switch components. By contrast, cold atmospheric conditions may result in icing and snow conditions that can hamper or interfere with the operation of the switch machine and one or more switch point components.

Turning now to the figures, wherein like reference numerals refer to like elements, there is shown one or more embodiments of a rail switch heater system 10 configured to prevent ice and predicted worst case cold atmospheric conditions from impeding the movement of railway switch machines and related switch components while minimizing operating costs associated with implementation and daily use of system 100.

Figure 2:
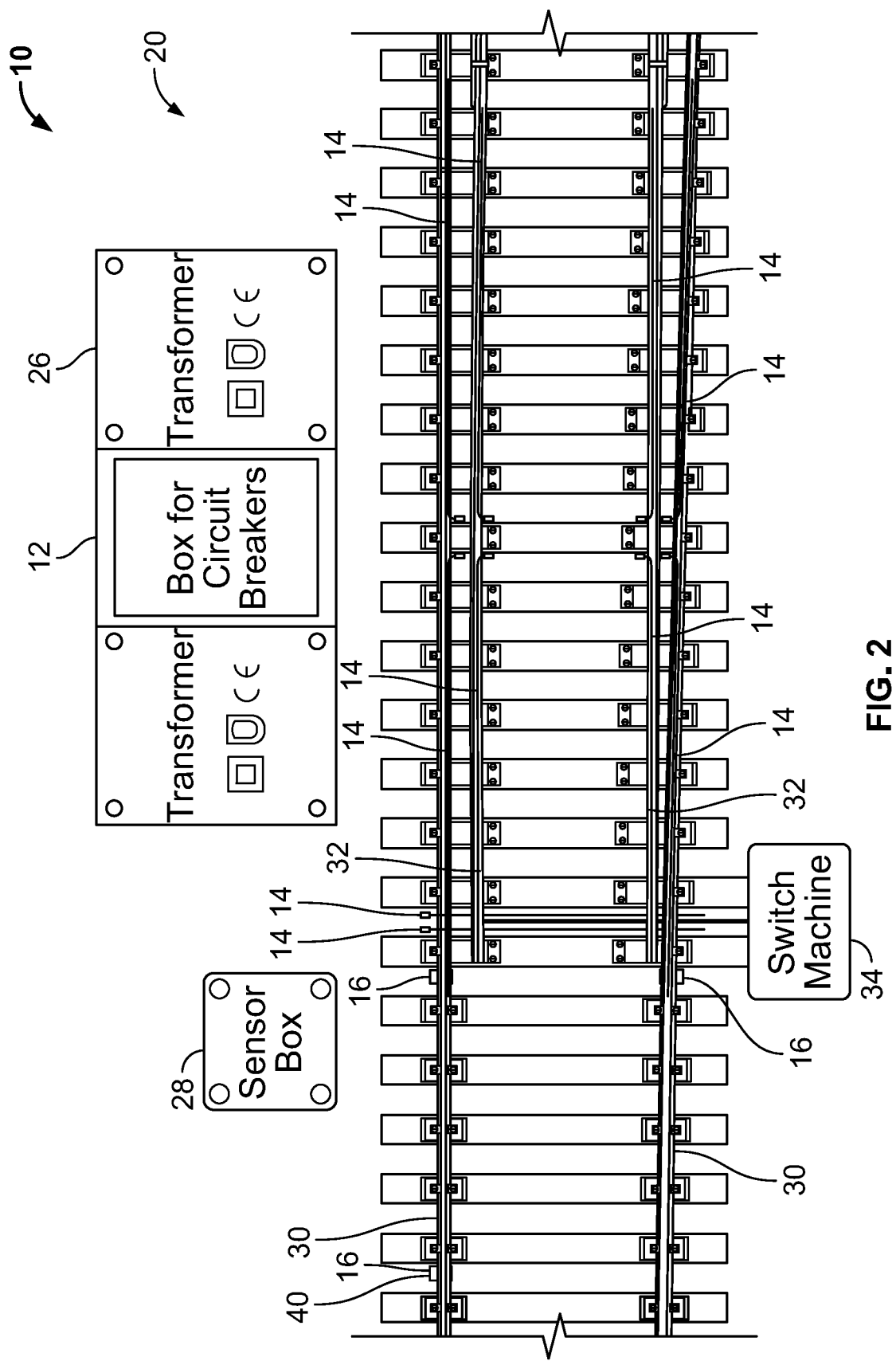
FIG. 2 is a top plan view of an exemplary rail switch system incorporating a rail switch heating system of the instant disclosure.
Figure 3:
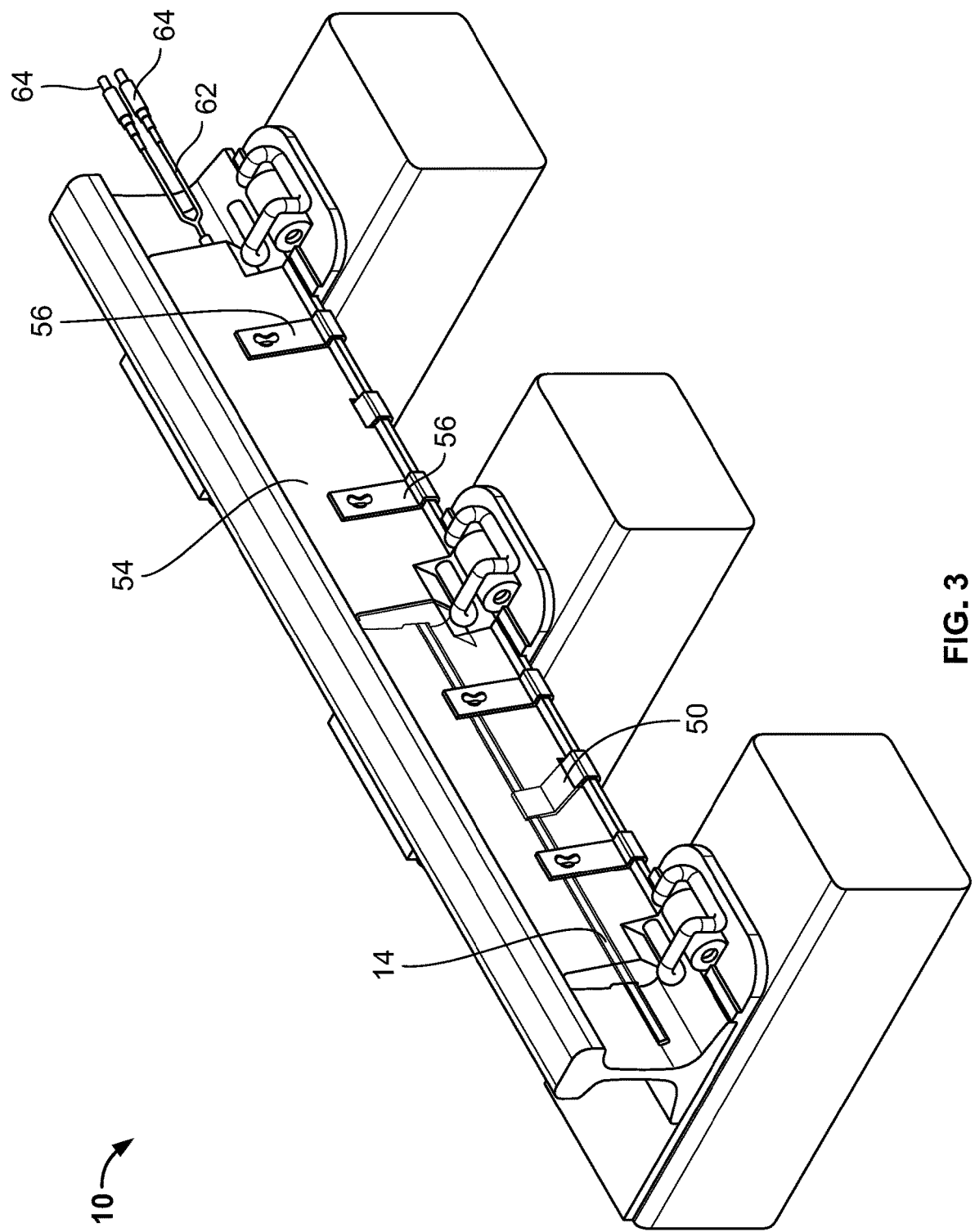
FIG. 3 is a partially transparent, front perspective view of a portion of a rail switch heating system of the instant disclosure.

As shown in the embodiment of FIGS. 1-4, system 10 includes controller 12, one or more rail heating elements 14 connected to the controller 12, and one or more sensors 16 connected to the controller 12. In some embodiments, as shown in FIG. 2, controller 12 is positioned in proximity to a railway switch system 20 to control the operation of one or more components of switch system 20 and/or one or more components of rail heating elements 14. As discussed below, controller 12 may include one or more software algorithms stored on memory and executable by a processor to control the operation of the one or more heating elements 14.

System 10 may also include weather station 18 having one or more atmospheric weather sensors to detect real-time atmospheric weather conditions. For example, weather station 18 may include one or more sensors to detect and/or measure atmospheric temperature, wind speed and direction, humidity, precipitation, and cloud cover, to name a few. A camera 22 configured to acquire still photographs or video, including live video, of the scene near the physical location of the controller 12 may be connected to weather station 18 and/or controller 12.

One or more antennas 24 configured to transmit and/or receive wireless data and/or communications may also be connected to weather station 18 and/or controller 12. For example, the one or more antennas 24 may be configured to transmit or receive any type of wireless signals, including, for example, cellular, satellite, Bluetooth, and Wi-Fi, using any form of wireless communications protocol and across any network. The one or more antennas 24 may be configured, for example, to transmit to a remote location, such as a server associated with a remote railroad dispatch system, data acquired from real-time image data from camera 22, real-time weather data acquired by weather station 18, real-time sensor data from the one or more sensors 16, real-time heating element data from the one or more heating elements 14, and real-time position or status data from any component associated with the railway switch system 20. Similarly, the one or more antennas 24 may be configured to receive wireless data from a remote location, such as from a server associated with the remote railroad dispatch system, and provide that data to controller 12 for disposition. Such data may include instructions to operate one or more components of heating elements 14 and/or switch system 20. Alternatively, or in addition to the foregoing wireless transmission methods, such data may be transmitted or received by wire. Whether received wirelessly or by wire, in some embodiments, the data may include current or forecasted weather data, which may be utilized by controller 12 to anticipate changing weather conditions and configure or operate, in advance of such changing weather, one or more heating elements 14 and/or switch system elements 20. In some embodiments, controller 12 may call upon historical weather data to automatically predict weather trends irrespective of, or in addition to, receiving current or forecasted weather data. The historical weather data may have been acquired and stored by controller 12 over any interval, such as daily, hourly, every quarter hour, or continuously. The algorithm of controller 12 may anticipate the need for heat on a given switch point component and cause specific ones of the one or more heating elements 14 to generate heat at an initial lower duty cycle to get ahead of changing ill weather or temperature conditions and to maximize the longevity of system 10 components by avoiding lengthy "on" duty cycles.

In some embodiments, railway switch system 20 includes a pair of running rails 30, a pair of switch rails 32, and a switch machine 34 connected to a switch rod 36. Switch rod 36 is connected to the pair of switch rails 32, and when actuated by the switch machine 34, the switch rod 36 moves the switch rails 32 adjacent to a respect one of the running rails 30.

Referring again to FIG. 2, the one or more sensors 16 may include any type of contact or noncontact, electrical or nonelectrical device capable of detecting or measuring a temperature, including a thermocouple, a resistance temperature detector (RTD), and a thermister, to name a few. The one or more sensors 16 may include one or more "cold" sensors 40 positioned on at least one of the running rails 30 and one or more "hot" sensors 42 positioned on at least one of the switch rails 32. The one or more cold sensors 40 are configured and positioned to detect and/or measure the temperature of running rail 30 that is not affected by any heat from the one or more heating elements 14 and to provide that data to controller 12. The one or more hot sensors 42 are configured and positioned to detect and/or measure the temperature of switch rail 32 in proximity to the position of one or more heating elements 14 and to provide that data to controller 12. In some embodiments, the one or more cold sensors 40 may be positioned approximately 2 meters away from the nearest heating element 14, and the one or more hot sensors 42 may be positioned approximately 10 cm away from the nearest heating element 14.

The one or more heating elements 14 may be positioned on one or more running rails 30, on one or more switch rails 32, and/or on or in proximity to switch rod 36. In some embodiments, one or more heating elements 14 are positioned on an inboard side of the respective rail 30,32 while one or more sensors 16, such as cold sensors 40 and/or hot sensors 42, are positioned on an outboard side of the respective rail, 30,32. In other embodiments, the more heating elements 14 and the sensors 16 are positioned on the same side of the rail, either on the inboard side or the outboard side of the rail.

Electrical leads associated with the one or more sensors 16 may be routed to one or more sensor boxes 28, and from there, routed to controller 12 (these connections in FIG. 2 are omitted for clarity). Similarly, the one or more heating elements are electrically connected to the controller 12 via one or more relays 72 (these connections in FIG. 2 are omitted for clarity).

The one or more heating elements 14 may include a tubular heater configuration comprising an electrically resistive heating element in a tubular sheath. The one or more heating elements 14 may alternatively include an electrically resistive heating element positioned in a crib heater, which may be positioned between railroad ties under the switch rod 36 on a mount where the electrically resistive heating element(s) are exposed and radiate heat upwardly toward the switch rod 36. The one or more heating elements 14 may alternatively include an electrically resistive heating element positioned in a pan heater comprising an enclosed pan that houses the electrically resistive heating element(s).

Turning to FIGS. 3-6, there is shown other elements of system 10 to provide extreme amounts of heat when needed for extreme weather conditions, while being energy efficient for less extreme weather conditions, and also providing a redundant heater solution to protect against a single point of failure. To affix one or more heating elements 14 to a rail, in some embodiments system 10 includes spaced apart spring clips 50 configured to wrap underneath and around the rail and self-retainingly connect to the bottom shoulders 52 of the rail. To reduce the ill effects of wind and contamination from debris, and to cause heat generated from the one or more heating elements 14 to reflect back to the rail rather than escape to the atmosphere, system 10 may include cover panels 54 that are retained in place via one or more spaced apart clips 56, which are themselves held in place via fasteners 58. At opposite ends, system 10 may include an end cap 60, which may be positioned perpendicularly or at angle to the rail to limit intrusion of wind behind the cover panels 54. Cover panels 54 and end caps 60 may be made from any durable material, including sheet metal. The sheet metal may be a form of stainless steel for corrosion protection. The electrical resistance wire positioned inside the tubular sheath of the one or more heating elements 14 may terminate at a terminal end 62 of the respective one or more heating elements 14. The terminal end may include a quick-disconnect terminal connector 64 to connect a source of electricity to the heating element 14, which as described below, arises when controller 12 causes a relay 72 to close an electrical circuit to energize the heating element 14.

Figure 4:
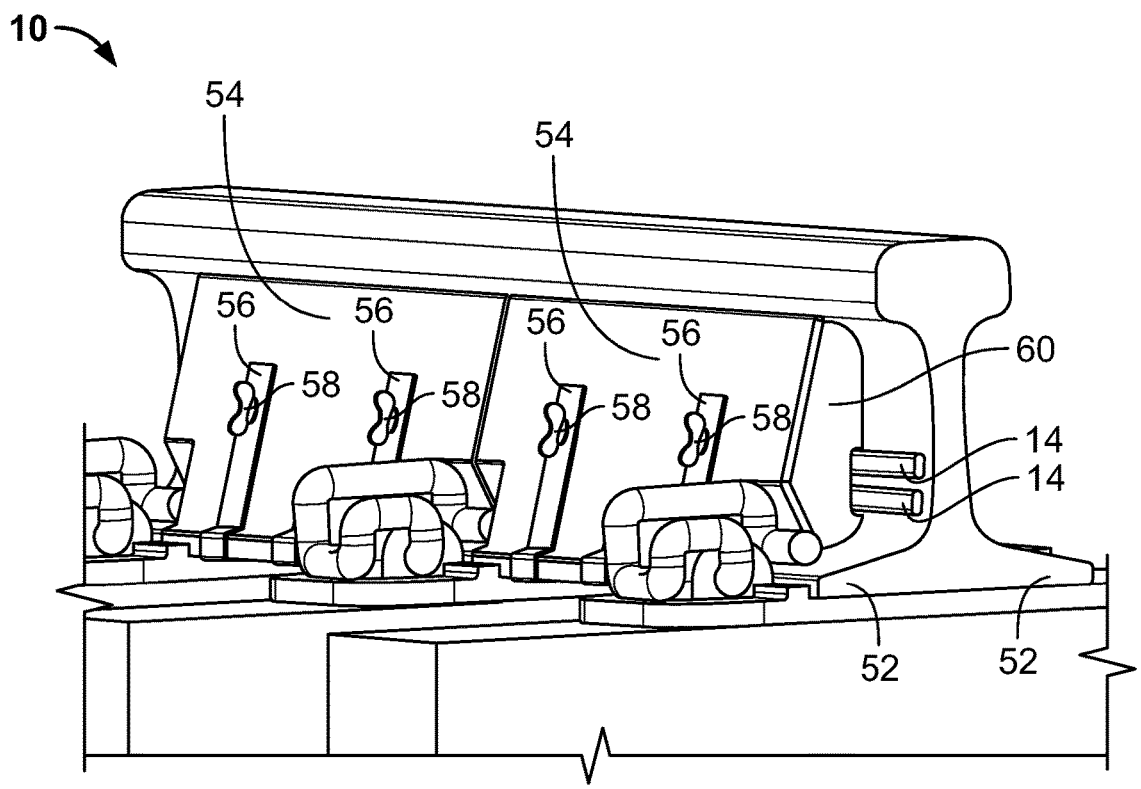
FIG. 4 is another front perspective view of a portion of a rail switch heating system of the instant disclosure.
Figure 5:
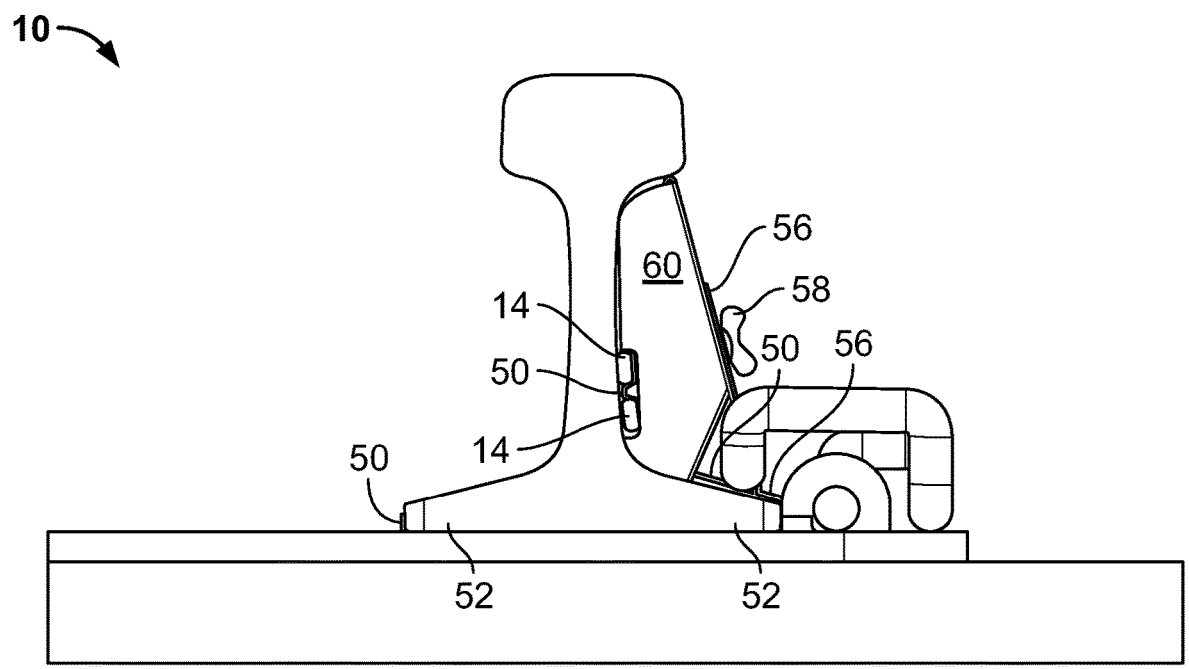
FIG. 5 is a left elevation view of the rail switch heating system shown in FIG. 4.
Figure 6:
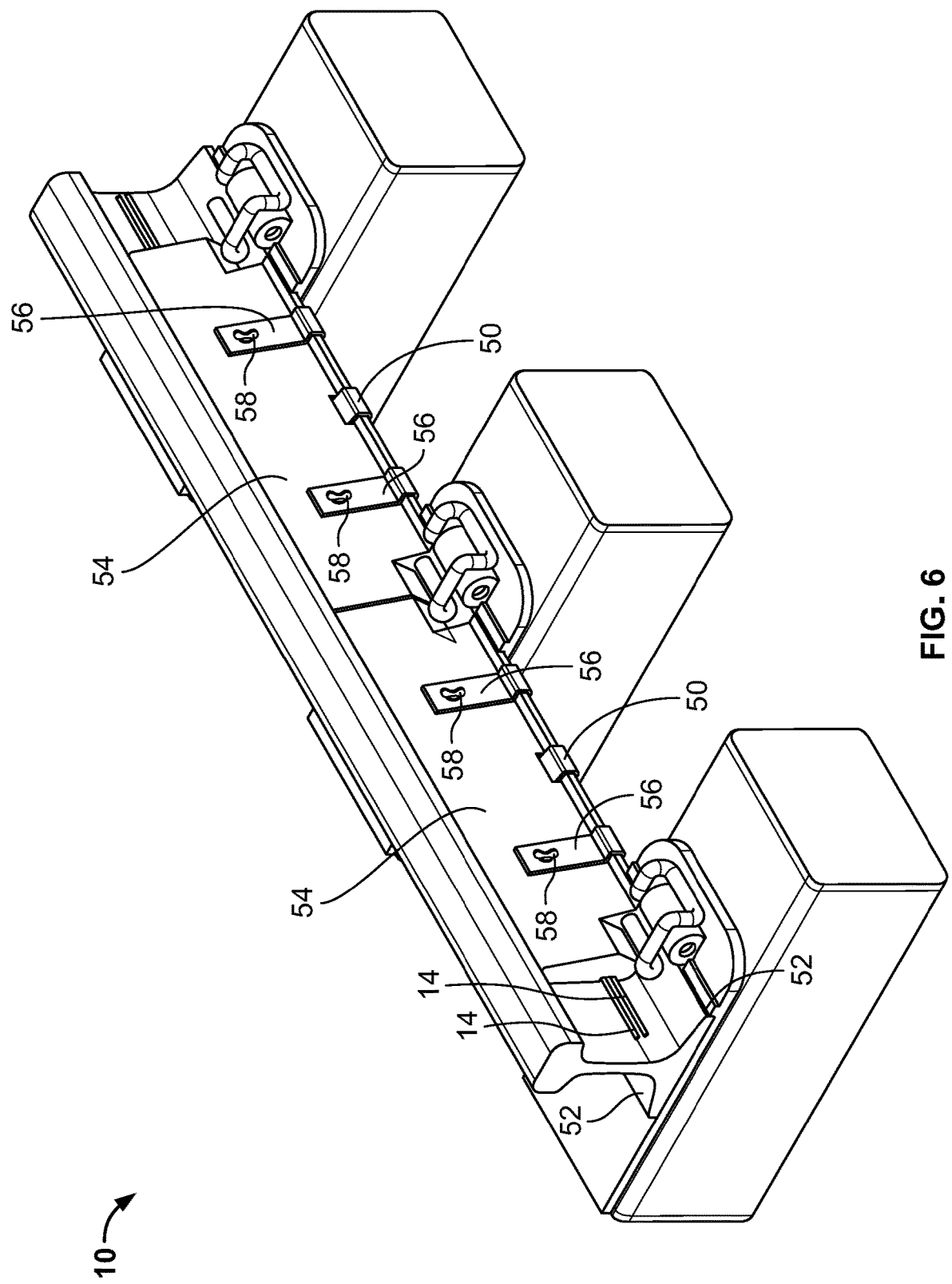
FIG. 6 is a front perspective view of a portion of a rail switch heating system of the instant disclosure.

As shown in FIGS. 4-6, a pair of heating elements 14 may be positioned parallel to one another and retained in place against the rail by spring clips 50. As will be discussed below, multiple heating elements 14 positioned in this way provide redundancy to failure, which may be important in remote geographical locations, environmental safety, and operational flexibility to economically adjust the amount of heat output to meet a given atmospheric demand.

Figure 7:
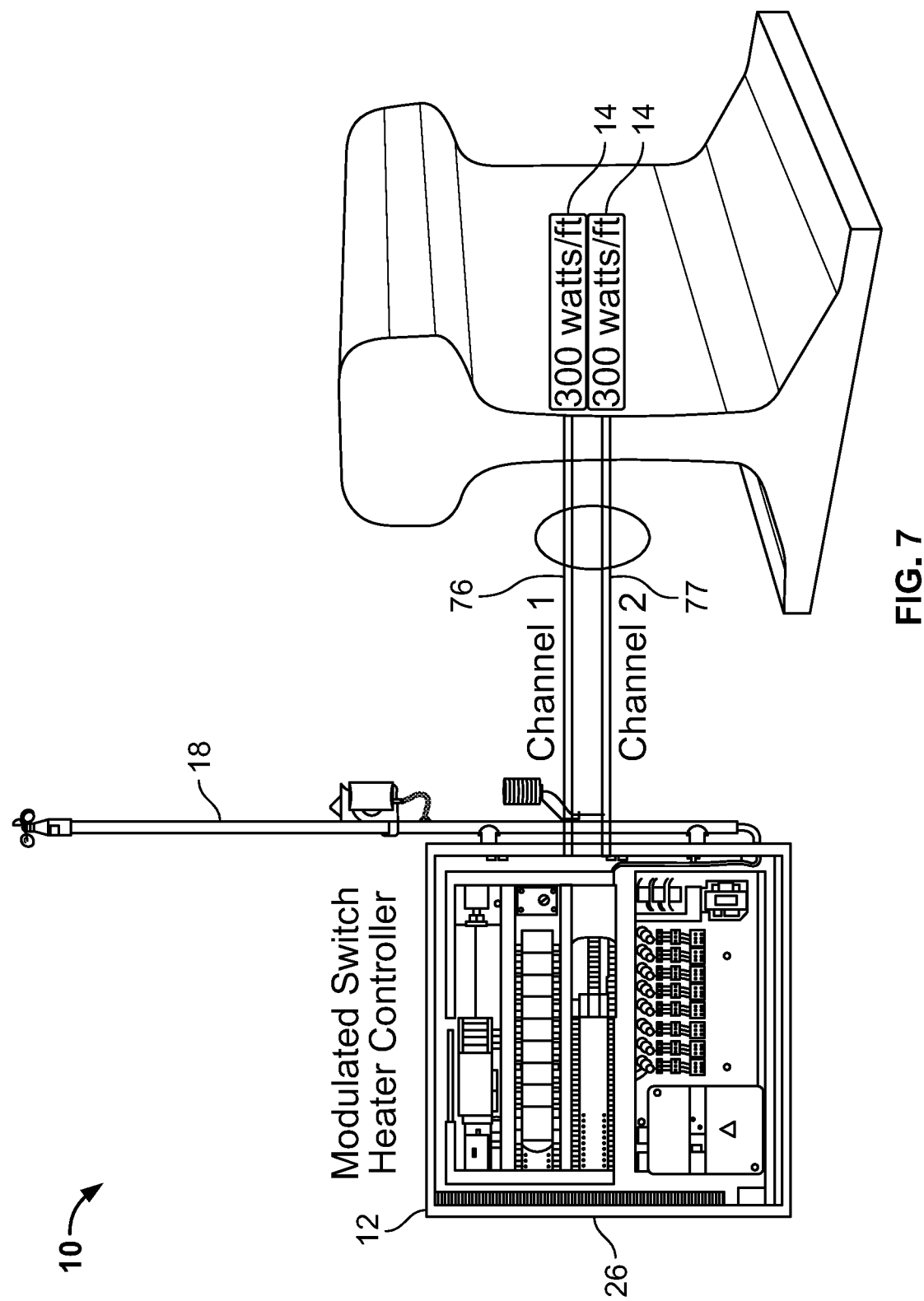
FIG. 7 is a schematic view of an aspect of a rail switch heating system of the instant disclosure.
Figure 8:
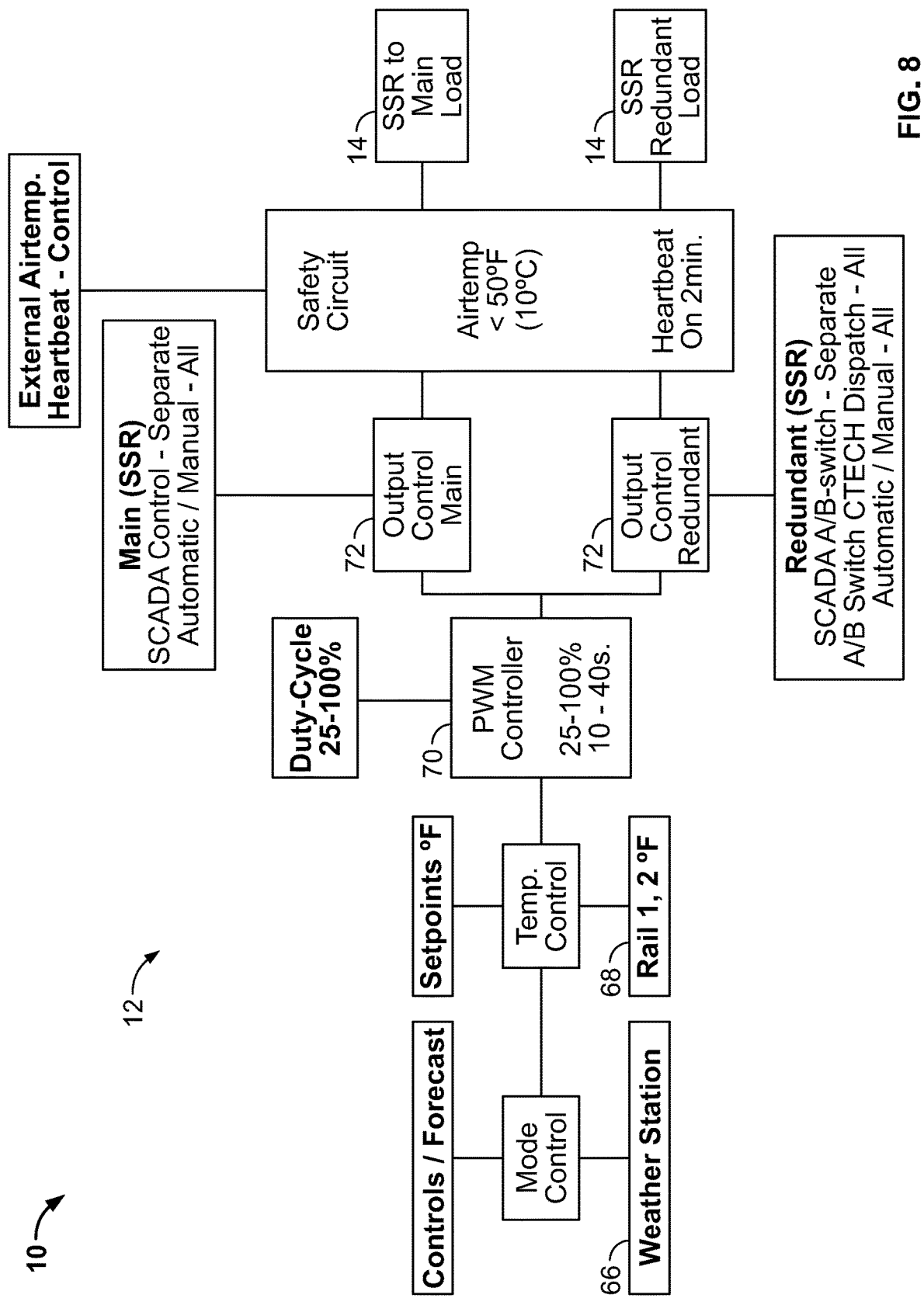
FIG. 8 is a schematic view of another aspect of a rail switch heating system of the instant disclosure.

As shown in FIG. 7-9, to accommodate varying weather conditions, system 10 may be configured to vary the wattage consumed by the one or more heating elements 14. In this embodiment, system 10 includes a pair of heating elements 14, each capable of consuming 300 watts per foot. In other embodiments, system 10 includes one or more heating elements 14 capable of consuming 250 watts per foot. In other embodiments, system 10 includes one or more heating elements capable of consuming any desired wattage per foot. In some embodiments, the heated length of the one or more heating elements 14 is approximately 36 ft. For example, a pair of 18 ft long, 250 watts per foot heating elements 14 positioned parallel to one another on a rail would provide the equivalent of 36 feet of a 500 watts per foot heating element 14. In other embodiments, the one or more heating elements 14 may be configured to any desired length and any wattage per foot.

In some embodiments, a target wattage of the one or more heating elements 14, which may be based on current or predicted weather conditions, may be achieved by averaging a pulsed duty cycle of power—PWM. This can be achieved by turning the one or more heating elements 14 on and off in varying duty cycles and at a specific modulation (frequency of the transition from on to off and from off to on). For example, a 250 watt per foot heating element 14 that is driven by a 480 VAC supply could achieve a 125 watt effective wattage per foot by using a duty cycle of 50% over a modulated frequency. Similarly, a pair of 250 watt per foot heating elements 14 may be driven at 100% duty cycle to provide 500 watts per foot when needed for extreme weather conditions. Thus, system 10 is able to vary the heat output from and the amount of energy consumed by the one or more heating elements 14 to achieve, for example, a target 100 watts per foot heater for a rainy day, and a target 200 watts per foot heater for a cold day. And if a single heating element 14 fails, system 10 may be configured with more than one heating element 14, which may be driven to their maximum heat output if needed. Thus, system 10 provides operational flexibility and redundancy, as well as time for railroad servicers to replace a failed component.

As shown in FIG. 7 (and also in FIGS. 2 and 10), controller 12 may be housed in a cabinet 26 positioned in proximity to the switch point. Controller 12 may alternatively be housed in cabinet 26 positioned at some distance from the switch point. The controller 12 may be electrically connected to each of the heating elements 14 positioned on or near the switch point, whether along a running rail 30, a switch rail 32, or in proximity to the switch rod 36. Power lines 75 and 76 connect controller 12 to respective ones of the heating elements 14 for independent control of each of the heating elements 14. System 10 may include one or more displays and user interfaces (including keyboard, touch screen display, mouse, etc.) mounted to or housed in cabinet 26. System 10 may also include data ports or other means for testing or configuring any component in the system.

The controller 12 is configured to receive various inputs and automatically provide outputs according to the exemplary schematic shown in FIG. 8. For example, controller 12 may receive current or predicted weather data 66 from weather station 18 and/or air temperature data 68 from the one or more sensors 16, and via algorithm 70 stored on memory and executed by a processor, determine the appropriate target wattage per foot to drive the one or more heating elements 14 (referred to in FIG. 8 as the main load and the redundant load). The controller 12 may utilize rail temperature data from the one or more sensors 16 to determine whether a predetermined threshold low temperature has been reached to begin to energize the one or more heating elements 14. Conversely, the controller 12 may utilize rail temperature data from the one or more sensors 16 to determine whether a predetermined high threshold temperature to de-energize the one or more heating elements 14.

The controller 12 communicates an output signal to one or more relays 72. Relays 72 may comprise either or both electromechanical relays or solid state relays (SSR's) for communicating operational commands to the one or more heating elements 14. However, SSR's provide over-voltage protection, over-current protection, temperature and operational usage stability, and improved switch times and longevity. In addition, given the varying pulse width modulation (PWM) determined by the control algorithm of controller 12 and provided to the one or more heating elements 14 via the one or more relays, SSR's may provide an alternative to electro-mechanical relays to avoid premature failure in the field. That said, a suitable, high duty cycle-capable electro-mechanical relay is available from Siemens AG, part number 3RT2037-1AF00. The controller 12 may include a safety circuit coupled with an algorithm to ensure that the atmospheric air temperature is below 50° F., for example, before commanding the one or more heating elements 14 to turn on. In this way, if the controller 12 is manually commanded, for example, during a test of the system, to provide a maximum wattage per foot command to the one or more heating elements 14 and system 10 detects that the air temperature is too warm to safely do so, then the safety circuit and safety algorithm may either cause the controller 12 to cease the output altogether or may limit the duration of the output command to the one or more heating elements 14.

Instead of automatically determining a target wattage per foot and the PWM command to achieve the automatically derived target wattage per foot based on weather data 66 and temperature data 68 inputs, in some embodiments the controller 12 may instead receive a target wattage per foot from, for example, a remote railroad dispatching center. Thus, system 10 provides the flexibility to operate the one or more heating elements 14 fully automatically, semi-automatically, or manually via local or remote data acquisition or input, and/or local or remote input commands to achieve a target wattage per foot of the one or more heating elements 14.

Either automatically or manually, the controller 12 initiates the flow of electrical current by causing the relay 72 to close an electrical circuit to feed the one or more heating elements 14 with electricity. Likewise, the controller 12 ceases the flow of electrical current by causing the relay 72 to open the electrical circuit, thereby interrupting the flow of electricity to the one or more heating elements 14. The controller 12 may cause the relay 72 to close and open the circuit as rapidly and as frequently as called for by a PWM model or schedule, within the physical limits of the relay 72, to achieve a target watts per foot of the one or more heating elements 14.

FIG. 9 shows a representative PWM schedule to operate an exemplary 250 watts per foot heating element 14. For example, to achieve 75 watts per foot consumption from a single 250 watts per foot heating element 14, a PWM duty cycle of 30% is required. This is achieved by (1) providing electrical current to the heating element 14 (thereby turning the heating element "on") for 12 seconds, then (2) ceasing the flow of electricity to the heating element 14 for 28 seconds, and (3) repeating the on-off cycles for as long as desired, needed, or predetermined. Similarly, to achieve 100 watts per foot consumption from a single 250 watts per foot heating element 14, a PWM duty cycle of 40% is required. This is achieved by (1) providing electrical current to the heating element 14 (thereby turning the heating element "on") for 16 seconds, then (2) ceasing the flow of electricity to the heating element 14 for 24 seconds, and (3) repeating the on-off cycles for as long as desired, needed, or predetermined. Duty cycles from 30% to 100% (full-time "on") are shown in the schedule of FIG. 9.

For a target watts per foot that lies between two values on the schedule, the schedule may be interpolated using known mathematical methods to arrive at an appropriate duty cycle. For example, to obtain a target 80 watts per foot, which lies between 75 watts per foot and 100 watts per foot, the algorithm may interpolate the PWM duty cycle to be 32%, which corresponds to a cycle that is 12.8 seconds on and 27.2 seconds off.

FIG. 9 also shows a PWM schedule to operate an exemplary pair of 250 watts per foot heating elements 14. In this embodiment, to achieve 275 watts per foot consumption from a pair of 250 watts per foot heating element 14, a PWM duty cycle of 55% is required. This is achieved by (1) providing electrical current to the pair of heating elements 14 (thereby turning the heating elements "on") for 22 seconds, then (2) ceasing the flow of electricity to the heating elements 14 for 18 seconds, and (3) repeating the on-off cycles for as long as desired, needed, or predetermined. Similarly, to achieve 300 watts per foot consumption from the pair of 250 watts per foot heating elements 14, a PWM duty cycle of 60% is required. This is achieved by (1) providing electrical current to the heating element 14 (thereby turning the heating element "on") for 24 seconds, then (2) ceasing the flow of electricity to the heating elements 14 for 16 seconds, and (3) repeating the on-off cycles for as long as desired, needed, or predetermined. Any duty cycle between 55% and 100% (full-time "on") is shown in the schedule of FIG. 9. As described above, the PWM schedule may be interpolated to achieve values that lie between any PWM value listed in the schedule.

Figure 10:
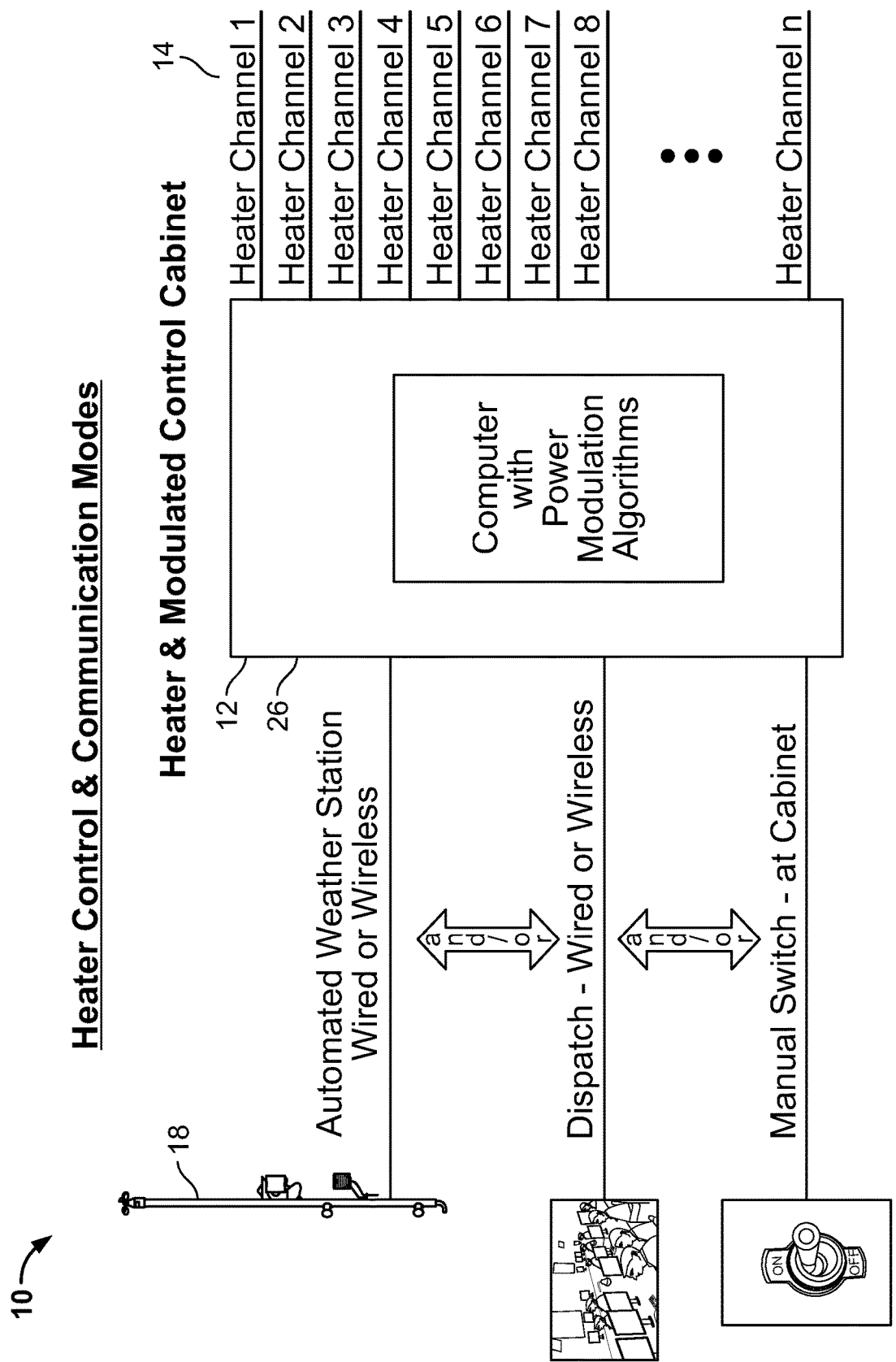
FIG. 10 is schematic view of another aspect of a rail switch heating system of the instant disclosure

As shown in FIG. 10, controller 12 of system 10 may simultaneously control power distribution to multiple individual heating elements 14 (or, for example, heating elements 14 arranged in pairs) positioned at various locations at a switch point, as also shown in FIG. 2. For example, channels 1 and 2 may route power over first and second power lines 76 and 77 (and in some configurations over first power line 75 and via first junction box 74) from first and second relays 72 to first and second heating elements 14 positioned on a running rail 30. Channels 3 and 4 may route power over third and fourth power lines 76 and 77 (and in some configurations over second power line 75 and via second junction box 74) from third and fourth relays 72 to third and fourth heating elements 14 positioned on a switch rail 32. Channels 5 and 6 may route power over fifth and sixth power lines 76 and 77 (and in some configurations over third power line 75 and via third junction box 74) from fifth and sixth relays 72 to fifth and sixth heating elements 14 positioned on or near a switch 36. A single cabinet 26 housing controller 12 can also include any number of relays 72 for distributing power to a commensurate number of heating elements 14 positioned at a switch point or at neighboring switch point(s) for controlling the heating thereof.

Controller 12 may be programmed to operate each of these heating elements 14 with a different duty cycle. For example, controller 12 may operate channels 1 and 2 on different duty cycles from one another, which duty cycles may be different than the duty cycles for channels 3, 4, 5, and 6, etc. Controller 12 may also operate channels 1 and 2 on the same duty cycle. Likewise, controller 12 may operate channels 3 and 4 on the same duty cycle, however, this duty cycle may be different than the duty cycle for Channels 1 and 2 as a pair.

In one embodiment, the cabinet 26 may include the following features:
Power supply 24 Vdc
UPS 24 Vdc
Battery 12 Vdc
230Vac powersupply—POE Camera
Circuit Breaker/Fuse 2 Amp 3 pol.
RTU Complete (CPU, GSM modem, DI, AI, DO)
Safety transformer to weather station
1 each Energymeter Main Power
3 each Current transformers—Place in power section
7 each Energymeters (Turnouts impedance)
14 each Current transformers (Turnouts impedance)—Place in power section
Safety Circuit delay timer
Internal thermostat to cabinet heater
Manual switches and push-button to Heartbeat
Touch Display 4,3" (Color)

Figure 11:
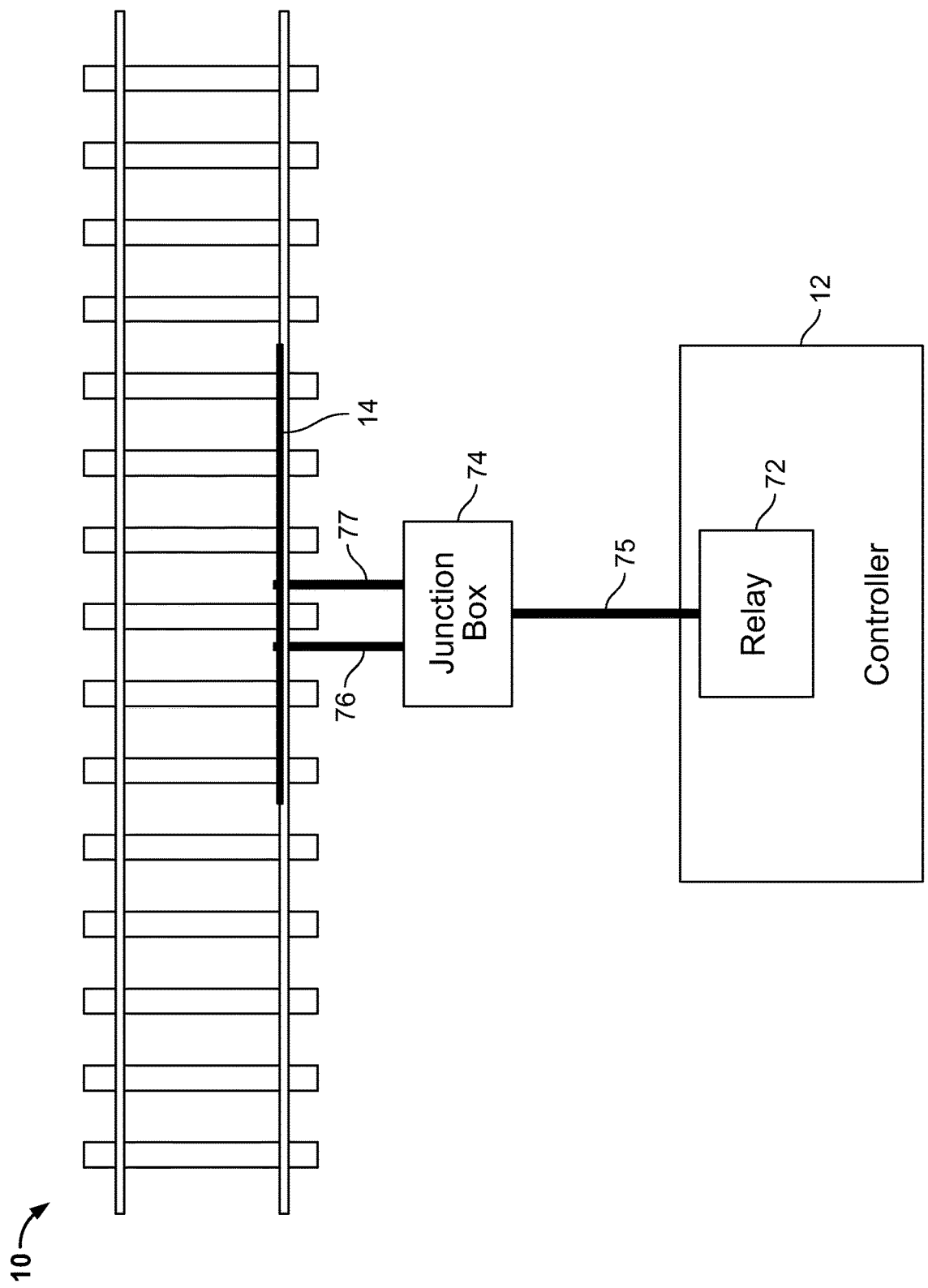
FIG. 11 is a schematic view of one embodiment of an aspect of a rail switch heating system of the instant disclosure.

In one embodiment, the controller 12 may have the following specifications and/or features:
Input:
Main Voltage: 480 VAC, 3-phase, 60 Hz
Control Power Voltage: 24 VDC, Regulated, UPS
 48 VAC, 60 Hz (Optional Weather Station)
Rail Temperature Sensors: 3-wire RTD, PT100, −50° C. to 50° C.
Converter: 4-20 mA control loop
Weather Station: Air temperature Sensor
 3-wire RTD, PT100, −50° C. to 50° C.
 Converter: 4-20 mA control loop
 Dual Precipitation Sensors
 Wnd Speed Sensor
Power monitoring: Power
 Current
Communication: GSM 4G/3G VPN (Optional)
 Modbus RTU
 Wireless 900 MHz FHSS
 WI-Fi
 Fiber Optic, Ethernet, RS485
Camera IP Camera Event controlled
Output (Load):
Voltage: 480 VAC, Phase to Phase, 60 Hz
Power: Driven by customer requirements
Channels Main: 7 Channels of switch point and rod heaters
 Main PWM between 25% and 100%
 Solid State PWM control all Main channels
Channels Redundancy: 7 Channels of redundant switch point heaters
 A/B switch SCADA on each channel 100%
 Redundant PWM between 25% and 100%
 Solid State PWM control all Redundant channels
Ground Fault Detection: Ground Fault Detection between 0.1 and 1.0 AAC
General
Back Up: UPS up to 2 Hours
Energy Monitoring: Voltage, Current, Power (kW) and Power Consumption (kWh)
Control Loop(s):—Automated control and monitoring with rail temp. sensors
 Advanced control with weather station and monitoring Safety circuit Turn off with Airtemp. higher at 50° F.
Energy efficient control loop with PWM
Redundancy and advanced heating control with redundant switch point heaters
Capability Cloud:
BluePoint SCADA Control & Monitoring system.
Incoming alarm handling
Outgoing alarm e-mail
Weather Forecast Snow warning/White frost (Optional)
SCADA Interface: Designed to directly interface with existing SCADA systems (Actual interface will vary with SCADA System design)
Cloud based SCADA: Cloud Based SCADA system designed to operate seamlessly with the Blue Point Control System.
Data collection—Live Log
Access from anywhere with any device
Automated email alerts to key personnel
Weather Event Forecasting (Optional)
Alarm Monitoring
Door Open, Power Failure, Ground Fault, Element Failure Sensors Failure, Battery Status, Manual Switches
Communication internal
Capability Acquisition
RTU record every 5 minutes to internal log in RTU
Server download every hour all RTU log data in SAN SQL DB
Logs presentation in SCADA
Export logs in Excel sheet by e-mail Turning now to FIG. 11 there is shown another embodiment for connecting and powering the one or more heating elements 14 of system 10 to controller 12. As shown in this embodiment, controller 12, which may be positioned some distance away from the rails 30,32 or switch rod 36 to be heated, comprises one or more relays 72, each connected to a junction box 74 by a single, controller-modulated power line 75. Junction box 74, which may be positioned in closer proximity to a rail 30,32 or switch rod 36 to be heated than controller 12, may be configured to communicate the modulated power feed over each power line 76 and 77 (representing a main power line for driving a first heating element 14 and a second or redundant power line for driving a second heating element 14) that are connected to respective heating elements 14, which are identified, for example, as main and redundant heating loads in FIG. 8.

In one possible mode of operation, either automatically or manually as described above, controller 12 may initiate the flow of electrical current by causing the relay 72 to close an electrical circuit and feed heating elements 14 with electricity via power lines 75,76,77 and via junction box 74. To distribute power to one or both of power lines 76,77, junction box 74 may include a fuse or circuit breaker to ensure that failure of one of the heating elements 14 will not cause the other heating element 14 to fail. The controller 12 may cease the flow of electrical current by causing the relay 72 to open the electrical circuit, thereby interrupting the flow of electricity to the one or more heating elements 14. The controller 12 may cause the relay 72 to close and open the circuit as rapidly and as frequently as called for by a PWM model or schedule, within the physical limits of the relay 72, to achieve a target watts per foot of the one or more heating elements 14. Thus, in this configuration, controller 12 can modulate the power over power line 75, and then junction box 74 can communicate the modulated power over power lines 76 and 77.

This arrangement enables easy retrofitting of existing railway heating systems that already have a single power line connecting a power source to a single rail heating element 14. It does this by avoiding the time, expense, and risk of trenching alongside the existing power line to lay an additional power line to power a second heating element 14 that is placed adjacent to an existing heating element 14 to arrive at the configuration shown in FIGS. 4-5, for example. This arrangement also results in a significant cost savings to retrofit existing rail systems because only minimal trenching from the junction box 74 to connect power line 76 to a first or main heating element 14 and to connect power line 77 to a second or redundant heating element 14 is required given the relative proximity of the junction box 74 (compared to the controller 12) to the rail 30,32 or switch rod 36 to be heated.

By contrast, the arrangement shown in FIG. 7, for example, with two power lines 76,77 directly connecting controller 12 to the pair of heating elements 14 may be easily implemented in new rail construction settings where a single trench can be dug to receive the pair of power lines 76,77 between the controller 12 and the rails 30,32 or switch rod 36 to be heated.

While specific embodiments have been described in detail, it will be appreciated by those skilled in the art that various modifications and alternatives to those details could be developed in light of the overall teachings of the disclosure. Accordingly, the disclosure herein is meant to be illustrative only and not limiting as to its scope and should be given the full breadth of the appended claims and any equivalents thereof.

The invention claimed is:

1. A rail switch heating system, comprising:
a controller comprising a processor and memory;
an electrically resistive heating element coupled to the controller, the heating element configured for mounting to and heating a railroad rail;
a first sensor coupled to the controller, the first sensor configured to detect and/or measure a temperature of the rail to provide first input data to the controller;
a second sensor coupled to the controller, the second sensor configured to detect and/or measure an air temperature in a vicinity of the rail to provide second input data to the controller; and
software stored on the memory and executable by the processor for executing the steps of:
automatically determining a target energy consumption for the heating element based on the first input data and the second input data;
automatically determining a pulse width modulated (PWM) cycle corresponding to the target energy consumption for cycling the heating element on and off; and
if either the first input data or the second input data fall below a first minimum threshold temperature corresponding to the first input data or a second minimum threshold temperature corresponding to the second input data, automatically cycling a flow of electricity on and off to the heating element in accordance with the PWM cycle.

2. The rail switch heating system of claim 1, including a second electrically resistive heating element coupled to the controller, the second electrically resistive heating element positioned in a pan in proximity to a switch rod of a railroad switch.

3. The rail switch heating system of claim 1, including a second electrically resistive heating element positioned on the rail and parallel to the electrically resistive heating element.

4. The rail switch heating system of claim 1, including a relay coupled to the controller for closing and opening an electrical circuit to energize and de-energize the heating element according to the PWM cycle.

5. The rail switch heating system of claim 4, wherein the relay is a solid state relay.

6. The rail switch heating system of claim 1, wherein the controller is configured to cease cycling the flow of electricity to the heating element upon occurrence of (1) the first input data exceeding a first maximum threshold temperature, (2) the second input data exceeding a second maximum threshold temperature, or (3) passage of a predetermined amount of time.

7. The rail switch heating system of claim 1, including a third sensor for detecting and/or measuring one or more environmental conditions in the vicinity of the rail.

8. The rail switch heating system of claim 7, wherein the one or more environmental conditions include at least one of air temperature, relative humidity, icing conditions, cloud cover, wind speed, wind direction, and barometric pressure.

9. The rail switch heating system of claim 1, including third input data to the controller, the third input data including at least one of a time of day and a date, wherein automatically determining the target energy consumption for the heating element is based on the third input data.

10. The rail switch heating system of claim 1, including an antenna for receiving weather forecast data from a remote server, wherein automatically determining the target energy consumption for the heating element is based on the weather forecast data.

11. The rail switch heating system of claim 1, including an antenna for transmitting the first input data to a remote server.

12. The rail switch heating system of claim 1, wherein the PWM cycle varies from 30% to 100% corresponding to a range of 75 watts per foot to 250 watts per foot effective average energy consumption for a 250 watts per foot heating element.

13. A rail switch heating system, comprising:
   a controller comprising a processor and memory;
   an electrically resistive heating element coupled to the controller, the heating element configured for mounting to and heating a railroad rail;
   a first sensor coupled to the controller, the first sensor configured to detect and/or measure a temperature of the rail to provide first input data to the controller;
   a second sensor coupled to the controller, the second sensor configured to detect and/or measure an air temperature in a vicinity of the rail to provide second input data to the controller; and
   software stored on the memory for executing the steps of:
      automatically determining a pulse width modulated (PWM) cycle corresponding to a target energy consumption for cycling the heating element on and off; and
      if either the first input data or the second input data fall below a first minimum threshold temperature corresponding to the first input data or a second minimum threshold temperature corresponding to the second input data, automatically cycling a flow of electricity to the heating element in accordance with the PWM cycle.

14. The rail switch heating system of claim 13, wherein the target energy consumption is automatically determined based on the first input data and the second input data.

15. The rail switch heating system of claim 13, including a relay coupled to the controller for closing and opening an electrical circuit to energize and de-energize the heating element according to the PWM cycle.

16. The rail switch heating system of claim 15, wherein the relay is a solid state relay.

17. The rail switch heating system of claim 13, wherein the controller is configured to cease cycling the flow of electricity to the heating element upon occurrence of (1) the first input data exceeding a first maximum threshold temperature, (2) the second input data exceeding a second maximum threshold temperature, or (3) passage of a predetermined amount of time.

18. The rail switch heating system of claim 13, including an antenna for receiving weather forecast data from a remote server, wherein automatically determining the target energy consumption for the heating element is based on the weather forecast data received by the controller.

19. The rail switch heating system of claim 13, wherein the PWM cycle varies from 30% to 100% corresponding to a range of 75 watts per foot to 250 watts per foot effective average energy consumption for a 250 watts per foot heating element.

* * * * *